US009252799B2

(12) United States Patent  
Chang et al.

(10) Patent No.: US 9,252,799 B2  
(45) Date of Patent: Feb. 2, 2016

(54) RECEIVER WITH ORTHOGONAL BEAM FORMING TECHNIQUE

(75) Inventors: Donald C. D. Chang, Thousands Oaks, CA (US); Yulan Sun, Canoga Park, CA (US); Frank Lu, Reseda, CA (US)

(73) Assignee: SPATIAL DIGITAL SYSTEMS, INC., Camarillo, CA (US)

( * ) Notice: Subject to any disclaimer, the term of this patent is extended or adjusted under 35 U.S.C. 154(b) by 115 days.

(21) Appl. No.: 12/951,995

(22) Filed: Nov. 22, 2010

(65) Prior Publication Data

US 2012/0063550 A1 Mar. 15, 2012

Related U.S. Application Data

(60) Provisional application No. 61/381,381, filed on Sep. 9, 2010.

(51) Int. Cl.
| | |
|---|---|
| *H04L 27/06* | (2006.01) |
| *H03M 1/20* | (2006.01) |
| *H03M 1/12* | (2006.01) |
| *H03M 1/06* | (2006.01) |
| *H04B 1/04* | (2006.01) |
| *H04B 7/10* | (2006.01) |
| *H03M 1/00* | (2006.01) |
| *H03M 1/08* | (2006.01) |
| *H03M 1/18* | (2006.01) |

(52) U.S. Cl.
CPC ............... *H03M 1/20* (2013.01); *H03M 1/002* (2013.01); *H03M 1/0641* (2013.01); *H03M 1/08* (2013.01); *H03M 1/12* (2013.01); *H03M 1/188* (2013.01); *H04B 1/0475* (2013.01); *H04B 7/10* (2013.01); *H03M 1/1215* (2013.01)

(58) Field of Classification Search
CPC ..... H04W 16/28; H04B 1/7107; H04B 7/0408; H04B 7/0617; H04L 25/03057
USPC .......................................... 375/232, 233, 347
See application file for complete search history.

(56) References Cited

U.S. PATENT DOCUMENTS

| | | | | |
|---|---|---|---|---|
| 4,070,642 | A * | 1/1978 | Iinuma et al. ................. | 367/105 |
| 4,246,585 | A * | 1/1981 | Mailloux ....................... | 342/373 |
| 4,270,223 | A * | 5/1981 | Marston ......................... | 455/305 |
| 5,164,959 | A * | 11/1992 | Cai et al. ....................... | 375/150 |
| 5,677,768 | A * | 10/1997 | Bockman ....................... | 356/487 |
| 6,879,647 | B1 * | 4/2005 | Myers ............................ | 375/336 |
| 7,187,949 | B2 | 3/2007 | Chang et al. | |
| 7,260,141 | B2 * | 8/2007 | Bierly et al. .................. | 375/222 |
| 7,720,472 | B1 | 5/2010 | Feria et al. | |
| 2002/0081969 | A1 * | 6/2002 | Chang et al. .................. | 455/13.1 |
| 2003/0086515 | A1 * | 5/2003 | Trans et al. ................... | 375/346 |
| 2005/0032513 | A1 * | 2/2005 | Norman et al. ............... | 455/423 |

(Continued)

*Primary Examiner* — Shuwang Liu  
*Assistant Examiner* — David S Huang

(57) ABSTRACT

A receiver with orthogonal beam forming technique is achieved that is capable of differentiating different signal components within the received composite signal. An adaptive processor is used to eliminate the signal component whose phase information is known or can be calculated. The phase information of the major component of a signal can be easily acquired by using a limiter. The phase information of other signal components can be acquired by their direction information and other characteristics, such as modulation scheme, etc. Multiple orthogonal beams can be formed by eliminating one unwanted signal component each time by the adaptive processor until all unwanted signal is eliminated. Thus, a composite signal from multiple sources can be broken down into their component signals.

20 Claims, 6 Drawing Sheets

(56) References Cited

U.S. PATENT DOCUMENTS

| | | |
|---|---|---|
| 2005/0088338 A1* | 4/2005 | Masenten et al. ............. 342/368 |
| 2008/0144737 A1* | 6/2008 | Naguib ......................... 375/299 |
| 2008/0279259 A1* | 11/2008 | Kobayashi et al. ........... 375/135 |
| 2010/0069014 A1* | 3/2010 | Haartsen et al. ........... 455/67.11 |
| 2010/0109951 A1* | 5/2010 | Taenzer ....................... 342/442 |
| 2011/0032173 A1* | 2/2011 | Chang et al. .................. 343/880 |
| 2011/0169689 A1* | 7/2011 | Wang et al. ................ 342/357.3 |
| 2012/0119795 A1* | 5/2012 | Bresniker et al. ............. 327/108 |

* cited by examiner

RECEIVER WITH ORTHOGONAL BEAM FORMING TECHNIQUE

RELATED APPLICATION DATA

This application claims the benefit, pursuant to 35 U.S.C. §119(e), of U.S. provisional application Ser. No. 61,381,381, filed Sep. 9, 2010.

BACKGROUND OF THE INVENTION

1. Field of the Invention

The present invention relates to the fields of wireless communications and antenna architecture and design, and, in particular, to adaptive smart antenna system architectures and designs. More specifically, but without limitation thereto, the present invention aims to create an antenna receiver system that is capable of forming multiple orthogonal beams and differentiating multiple received signals by eliminating signal components whose phase information or other characteristics are known or can be acquired.

2. Description of Related Art

In the field of wireless communications, antennas are widely used to transmit or receive data in the form of radio frequency signals from one place to another. Antennas are used in fields such as satellite, radio, television broadcasting, and cellular phone communications, among other things. These antennas can come in all shapes and sizes, ranging from traditional dish antennas, to antenna arrays that utilize multiple elements.

The performance of an antenna is degraded by the presence of an interfering signal, which can be defined as a signal originating from a source external to the desired signal path that produces undesired artifacts in the signal. This can be intentional interference, such as a jamming signal, or unintentional interference, such as receiving signals from a nearby satellite that is being broadcast on the same frequency. Additionally, when the strength of the interfering signal is too strong the communication quality becomes too low to maintain proper service.

Interference due to signal transmission on same frequencies can pose a problem for ground terminals attempting to transmit or receive signals from a desired source, such as a satellite. Several schemes have been designed to distinguish between signals. For example, digital and analog filters which may be easily implemented to differentiate received signals with different frequencies are widely used today. However, these systems do not present an adequate solution when the frequency of interfering signals are the same or very close to the desired signal.

One possible solution to overlapping frequency use is to use smart antennas equipped with digital beam forming (DBF) techniques to distinguish between signals originating from different directions by forming an orthogonal beam in the direction of the desired signal, while simultaneously forming a null at the direction of interfering sources. This provides an adequate solution to frequency use overlap as the antenna only picks up signals from the desired direction. While DBF techniques solve the issue of multi-directional, multi-signal interference, these smart antennas do not adequately solve the issue of multiple signal, differing strength signals being broadcast from relatively close directions.

The present invention takes advantage of the difference of signal strengths, corresponding directional information and other signal characteristics to calculate the phase information of unwanted signals and eliminate them using an adaptive algorithm. Different from other smart antennas utilizing beam-forming techniques, this invention focuses on eliminating unwanted signal components by adaptively minimizing the correlation between a desired signal and any unwanted components.

REFERENCE

1. Donald C. D. Chang et al, "Multiple Basestation Communication System Having Adaptive Antennas," Mar. 6, 2007, U.S. Pat. No. 7,187,949
2. Ying Feria et al, "Stratospheric-Based Communication System Having Interference Cancellation," May 18, 2010, U.S. Pat. No. 7,720,472

SUMMARY OF THE INVENTION

The present invention provides a dynamic communication system suitable for dynamically receiving incoming signals from multiple satellites to a receiver. More specifically, the present invention pertains to an adaptive signal differentiation scheme which is capable of distinguishing between signals by their strength difference and directional information.

An embodiment of the present invention comprises an antenna receiver system and a signal processing unit. With no limitation thereto, the antenna receiver for the current embodiment is an antenna array. Generally, a plurality of signals are received by the antenna system and then transmitted to the signal processing unit. There the processing unit coherently separates the signals using a system of weighting components and iterative loops, thus creating usable, separate signals.

Additionally, an embodiment of the present signal differentiation scheme further comprises a limiter, an adaptive processor and a phase alignment module. A limiter is an electronic device which simply converts a data sample greater or equal to zero into 1, and others into −1. Since the phase of a signal is determined mostly by the largest signal component of the signal, the output of the limiter approximately reflects the signal component with the strongest signal strength, and ignores all the amplitude information of input signals. The phase information is transmitted to the adaptive processor where a closed adaptive loop is used to iteratively eliminate the signal component which has the same phase as the strongest signal component, thus eliminating the strongest signal component of the signal. Similarly, other signal components can be eliminated if their phase information is known, or can be calculated, i.e. by their direction of arrival.

The present invention is not limited to one interfering source. In the case of multiple interfering sources, the present signal differentiation scheme may be applied to elimination of one interfering signal component at a time until all the interference is eliminated or differentiated into their component signals.

Additionally, other characteristics of a signal component, such as its modulation scheme can also provide useful information to generate an approximation of the signal component which can be used to eliminate the signal component in the adaptive processing.

DETAILED DESCRIPTION OF THE PREFERRED EMBODIMENT

The present invention relates to the field of communications systems and adaptive antenna design. More specifically, but without limitation thereto, the present invention provides an adaptive scheme which is capable of receiving and distinguishing between two or more radio frequency signals with differing signal strengths regardless of transmission directions.

Figure 1:
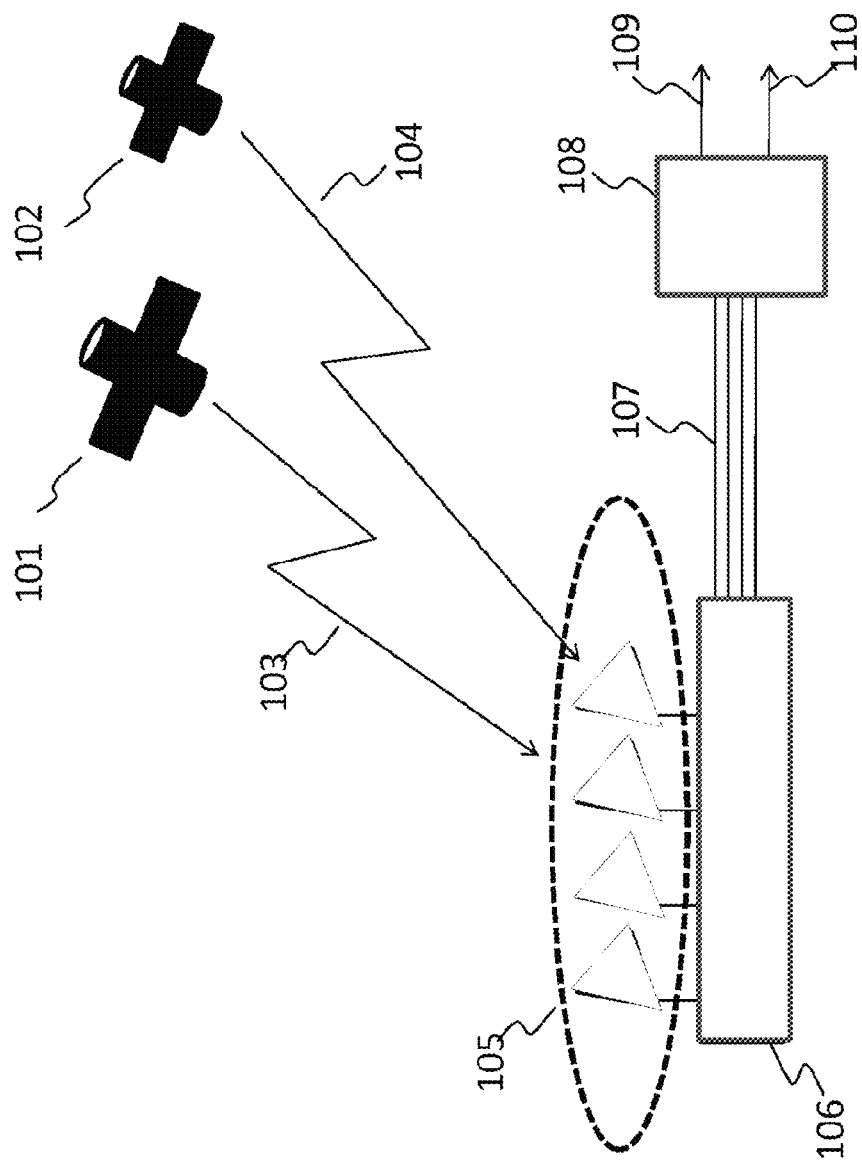
FIG. 1 illustrates an embodiment of the structure of the signal differentiation system.

As shown in FIG. 1, in an embodiment of the present invention, radio frequency (RF) signals 103, 104 transmitted from satellites 101, 102 are received by multiple-element antenna array 105. The signals from each satellite interfere with each other at the receiver side which means the composite signal received by each antenna element includes signals from both satellites. To distinguish these signals 103, 104 from each other, the received composite signal from each antenna element is first down-converted to base band and converted to digital signal 107 by the receiver module 106, and then transmitted to the digital signal processor 108 which utilizes an adaptive identification scheme to identify both signals 109, 110 individually based on their power difference and direction information.

Figure 2:
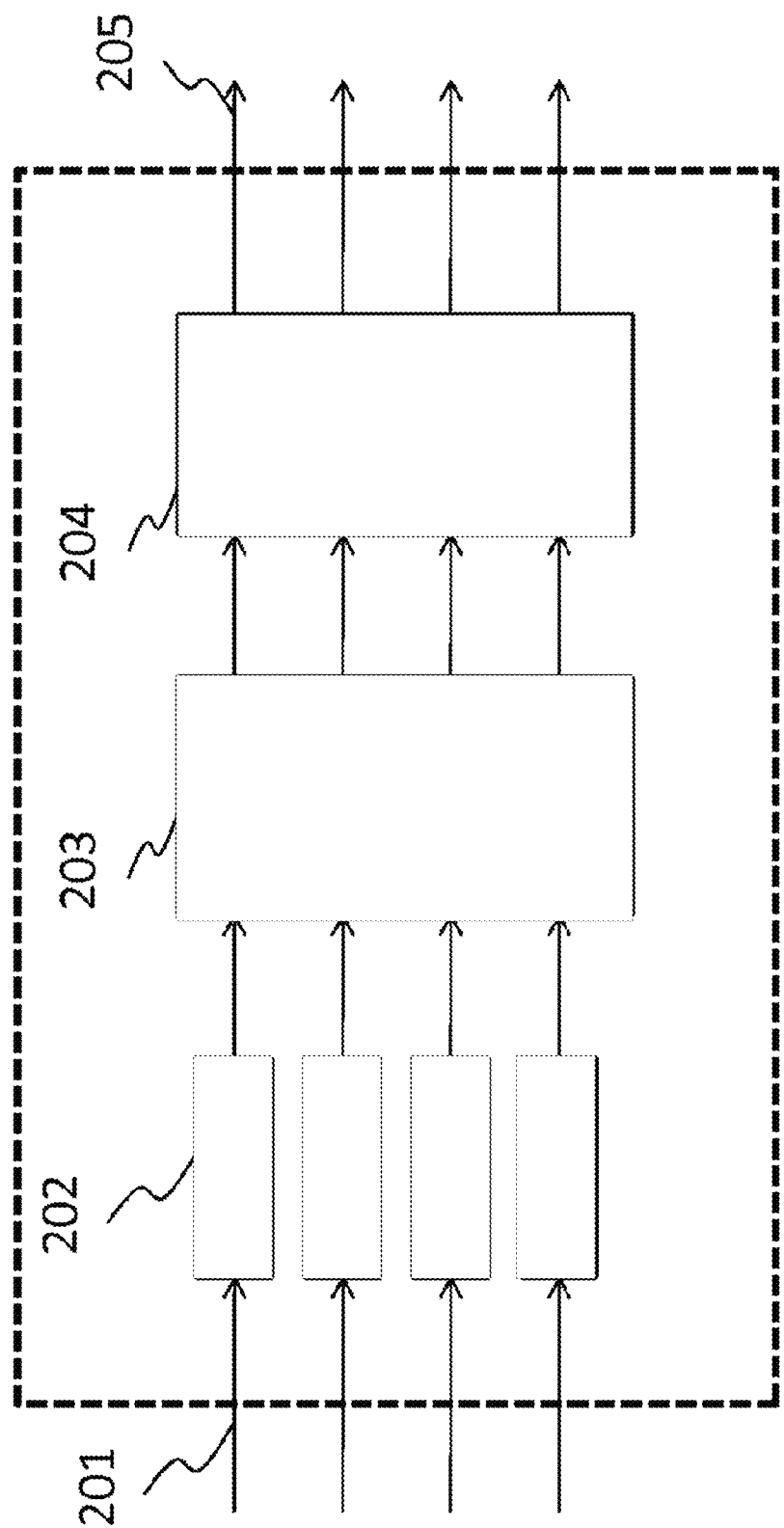
FIG. 2 shows a general structure of the signal receiver module.

FIG. 2 shows the general structure of receiver module in the present invention. The high frequency, analog signal 201 from each channel are treated by low noise amplifiers 202, and then down-converted to baseband by signal down-converters 203. The baseband analog signals are then converted to digital signals 205 by analog-to-digital (A/D) converters 204 and transmitted to signal identification module 108 as shown in FIG. 1.

Figure 3:
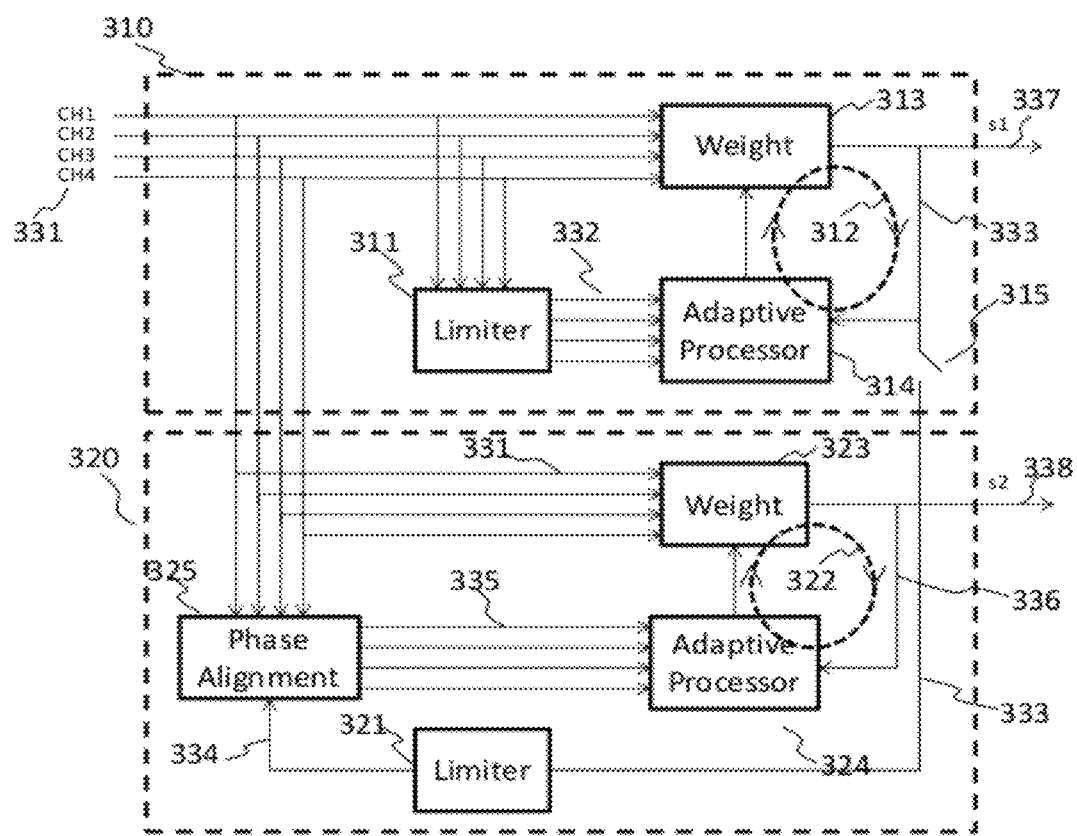
FIG. 3 illustrates a schematic view of the present signal differentiation system.

FIG. 3 gives the schematic view of our present signal identification scheme utilized by the digital signal processor 108. Input signals 331 coming from the multiple-element antenna array are routed through two adaptive processes 310, 320 which output the signal component with lower power 337, and the signal component with stronger power 338, respectively. In the first adaptive process 310, the composite signal is split, with a portion going to limiter 311, which converts a positive or zero signal sample into 1 and a negative signal sample into −1, and another portion going to the element weighting processor 313.

This invention focuses on eliminating unwanted signal components by adaptively minimizing the correlation between a desired signal and any unwanted components. Limiter 311 is used to generate four approximations 332 of the larger one of two signal components 331 in each channel as one input (the total number of inputs equaling the number of elements in the antenna array) to the adaptive processor 314 adaptively performing minimizing the correlation between a feedback signal 333, i.e. the above-mentioned desired signal, and approximation 332 of the larger one of the signal components 331, i.e. the above-mentioned unwanted components. The other input 333 from the beam output 337 is generated by applying complex weight 313, which is a set of complex number to change the amplitude and phase, to each channel of input signals 331. The input signals 331 are then processed within iterative loop 312 until certain criteria are reached. In each iteration, the adaptive processor 314 updates the complex weight 313 to generate a new output signal 337, which also returns to the adaptive processor as feedback via the path 333. The loop stops either when the correlation of returned signal in the path 333 and approximation 332 of the larger one of the signal components 331 becomes smaller than a preset signal strength threshold, or the number of iterations reaches a predefined number. Since the phase of the signal 331 is determined mostly by the largest signal component of the signal 331, the output of the limiter 311 approximately reflects the signal component 332 with the strongest signal strength, and ignores all the amplitude information of input signals 331. The phase information is transmitted to the adaptive processor 314 where a closed adaptive loop 312 is used to iteratively eliminating the signal component which has the same phase as the strongest signal component 332, thus eliminating the strongest signal component of the signal 331. Similarly, other signal components can be eliminated if their phase information is known, or can be calculated, i.e. by their direction of arrival. As a result of the iterative processes, the process 310 identifies the smaller signal component in the smaller strength signal 337 output to the second loop to trigger the process 320 which is to identify the large signal component in the signal 338 with the stronger signal strength.

The second process 320 also includes an adaptive loop 322 which is very similar to the adaptive loop 312 in the first process 310. The difference is that the input signal to the second loop 335 is an approximation of the signal with smaller signal strength, comparative to one with the larger signal strength 332. A limiter 321 is used to generate an approximation 334 of the smaller strength signal 333 that is reconstituted at the output by the first adaptive process 310. A phase alignment module 325 is applied to align the phase of approximation signal 334 with the phase of smaller signal component in each channel of the original input signal 331 by applying four different complex weights to signal 334 according to their phase difference. The phase information of the smaller component of original input signal 331 can be calculated according to the directional or modulation information of the satellites. Similar to the first adaptive loop 312, the second loop terminates and outputs the stronger signal 338 when the correlation between the feedback 336 and input signal 335 become smaller than a preset threshold.

Figure 4:
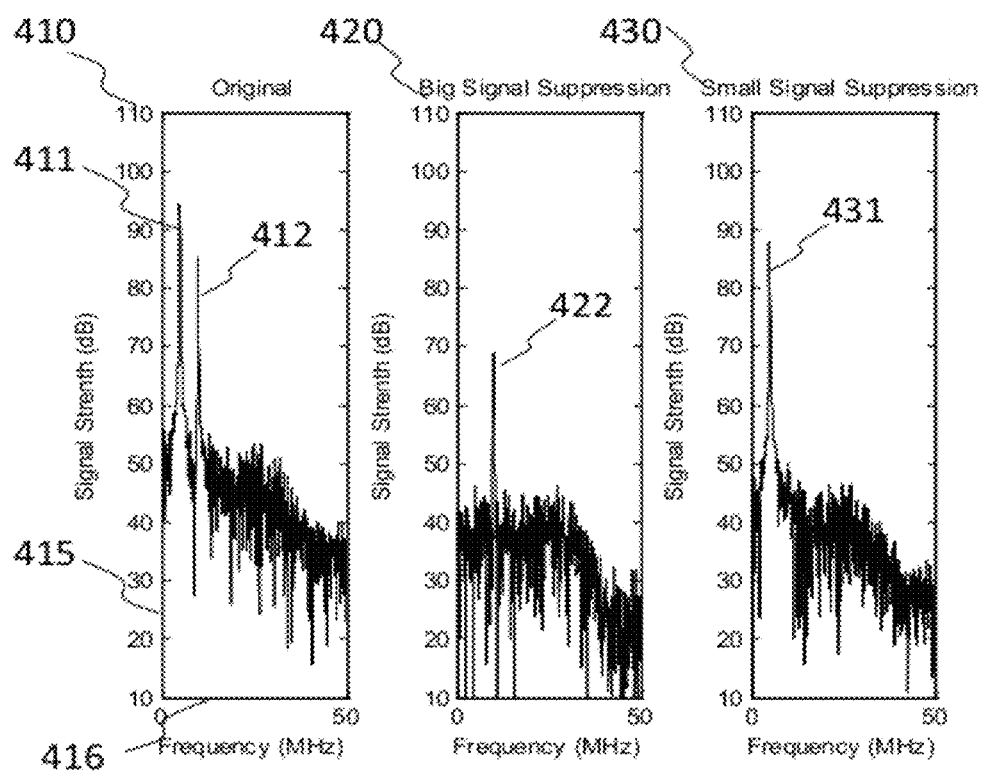
FIG. 4 presents several graphs showing the results of the adaptive signal differentiation algorithm, showing the original signal, suppression of the stronger signal, and suppression of the weaker signal.

FIG. 4 demonstrates the result of our adaptive orthogonal beam forming scheme. Graph 410 shows the spectrum output of the original input signal 331. Graph 420 illustrates the spectrum output of the first adaptive process 337, showing how the stronger signal has been reduced to the level of background noise. Graph 430 shows the spectrum output of the second adaptive process 338, illustrating how the weaker strength signal has been reduced to the level of background noise as well. The frequency axis 416 spans from 0 to 50 MHz (megahertz). The vertical axis 415 which represents the signal strength ranges from 10 dB to 110 dB (decibels). As shown in spectrum graph 410, the original input signal includes two signal components 411, 412 which come from two satellites 101 and 102 as shown in FIG. 1. In the present simulation, the signal component 411 has stronger signal strength of more than 90 dB and a lower frequency. Using signals with different frequencies is for demonstration purposes. The present signal differentiation scheme can be adapted for other applications as well, such as differentiating two signals on the same frequencies if directional information of the satellites is known. Spectrums 420, 430 show the output of first and second adaptive process, respectively. In comparison with spectrum 410, only the smaller signal component 422 is left in spectrum 420, while only the large signal component 431 is shown in spectrum 430.

Figure 5:
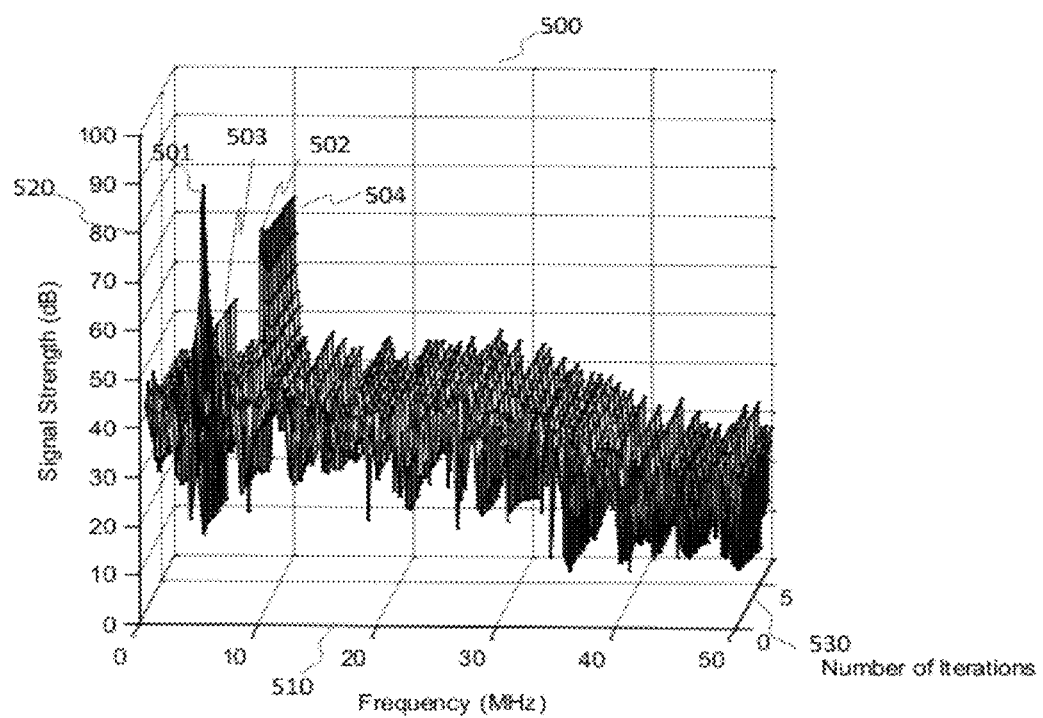
FIG. 5 depicts the suppression process of the signal with stronger signal strength

FIG. 5 is a 3-dimensional plot which illustrates the process of eliminating the signal with stronger signal strength in the first adaptive process 310. Frequency is represented on the x-axis 510, which ranges from 0 to 50 MHz. Signal strength is represented on the z-axis 520 ranges from 0 dB to 100 dB. The y-axis 530 represents the number of iterations performed to differentiate the signal, ranging from 0 to 8. Before the adaptive process begins (num of iteration=0), the signal component 501 has a larger signal strength than signal component 502. When the adaptive processing begins, the strength of signal 501 drops significantly with each iteration, eventually stabilizing as signal 503. At this point, signal 503 is roughly the same strength as the background noise. In comparison to signal 502, processed signal 503 is not in the same strength range. At the end of the adaptive processing (num of iteration=8), the remainder of the larger signal 503 is close to the noise level, whereas the strength smaller signal 504 has little to no change of signal strength taking place.

Figure 6:
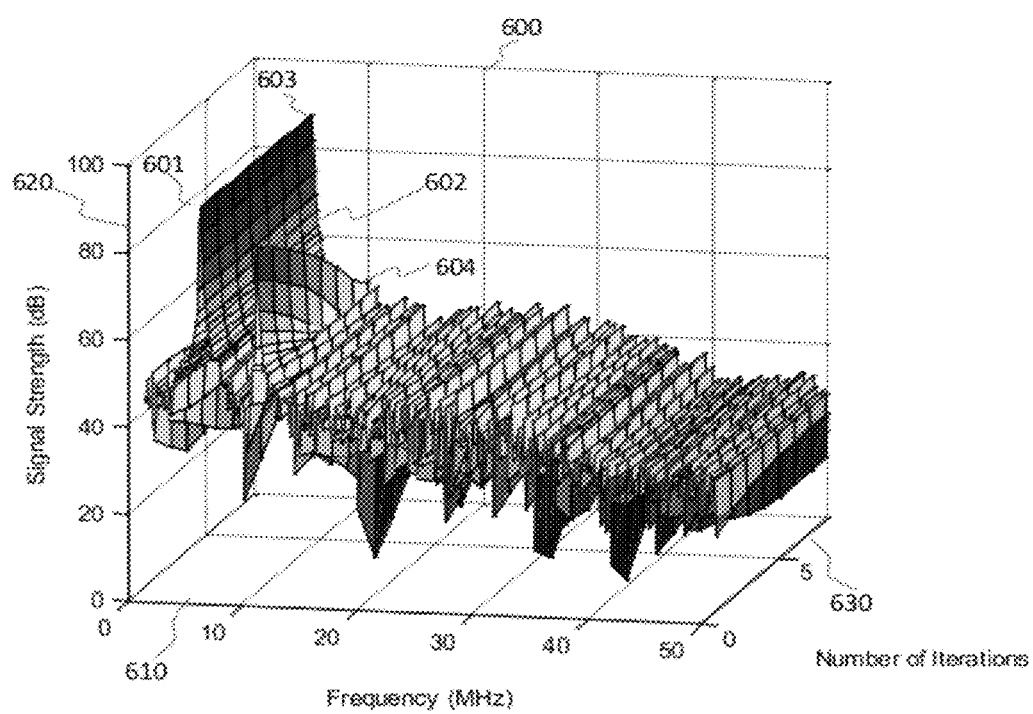
FIG. 6 illustrates the suppression process of the signal with smaller signal strength.

FIG. 6 illustrates the output of each loop of the second adaptive process. Frequency is again represented on the x-axis 610 in megahertz, the number of iterations is represented by the y-axis 630, and the signal strength in decibels is represented on the z-axis. Contrary to the first adaptive process shown in FIG. 5, the signal strength of the larger signal 602 remains relatively unchanged through each iteration. After 8 iterations signal 604 has the same signal strength as when the adaptive process began. However, signal strength of signal 601 dropped dramatically after 8 iterations to signal 603. Here, signal 603 has roughly the same signal strength as the background noise.

What is claimed is:

1. A receiver comprising:
an antenna array system;
a conditioning unit arranged downstream of said antenna array system, wherein said conditioning unit is configured to convert a first signal into a second signal; and
a signal processing unit arranged downstream of said conditioning unit, wherein said signal processing unit comprises a first limiter configured to approximate a first value of a sample of said second signal into a second value, a first weighting processor arranged in parallel with said first limiter, wherein said first weighting processor is configured to apply a first complex weight to said second signal so as to generate a third signal, and a first adaptive processor configured to update said first complex weight based on first information associated with said third signal and said second value.

2. The receiver of claim 1, wherein said conditioning unit is connected to multiple outputs of said antenna array system, wherein said conditioning unit comprises multiple amplifiers, a frequency down-conversion portion coupled to multiple outputs of said amplifiers, and a digitizing portion coupled to multiple outputs of said frequency down-conversion portion.

3. The receiver of claim 2, wherein said frequency down-conversion portion comprises multiple frequency down-converters arranged downstream of said amplifiers and upstream of said digitizing portion.

4. The receiver of claim 2, wherein said digitizing portion comprises multiple analog-to-digital converters arranged downstream of said frequency down-conversion portion.

5. The receiver of claim 1, wherein said signal processing unit further comprises a second limiter configured to approximate said third signal into a fourth signal and a phase alignment module configured to align a phase of said second signal with its input associated with said fourth signal so as to generate a fifth signal.

6. The receiver of claim 5, wherein said signal processing unit further comprises a second weighting processor configured to apply a second complex weight to said second signal so as to generate a sixth signal and a second adaptive processor configured to update said second complex weight based on second information associated with said fifth and sixth signals.

7. The receiver of claim 1, wherein said first signal is digitized, amplified and frequency down-converted by said conditioning unit into said second signal.

8. The receiver of claim 1, wherein said first adaptive processor is configured to update said first complex weight based on said first information associated with a correlation of said third signal and said second value.

9. The receiver of claim 8, wherein said first adaptive processor is configured to iteratively update said first complex weight until said correlation is less than a threshold.

10. The receiver of claim 1, wherein said signal processing unit further comprises a second weighting processor configured to apply a second complex weight to said second signal so as to generate a fourth signal and a second adaptive processor configured to update said second complex weight based on second information associated with said fourth signal.

11. The receiver of claim 1, wherein said first limiter configured to approximate said first value of said sample of said second signal into said second value comprises said first limiter configured to convert a positive value into one.

12. A receiver comprising:
an antenna array system;
a conditioning unit arranged downstream of said antenna array system, wherein said conditioning unit is configured to convert a first signal into a second signal; and
a signal processing unit arranged downstream of said conditioning unit, wherein said signal processing unit comprises a set of weighting processors comprising a first weighting processor configured to apply a first complex weight to said second signal so as to generate a third signal and a second weighting processor configured to apply a second complex weight to said second signal so as to generate a fourth signal, a first adaptive processor having an input associated without information output from said set of weighting processors other than said first weighting processor and configured to update said first complex weight based on first information associated with said third signal, and a second adaptive processor configured to update said second complex weight based on second information associated with said third and fourth signals.

13. The receiver of claim 12, wherein said signal processing unit further comprises a limiter configured to approximate said second signal into a fifth signal, wherein said first adaptive processor is configured to update said first complex weight based on said first information associated with said third and fifth signals.

14. The receiver of claim 13, wherein said first adaptive processor is configured to update said first complex weight based on said first information associated with a correlation of said third and fifth signals.

15. The receiver of claim 12, wherein said second adaptive processor is configured to update said second complex weight based on said second information associated with a correlation of said fourth signal and a fifth signal related to said third signal.

16. The receiver of claim 12, wherein said first signal is amplified, frequency down-converted and digitized by said conditioning unit into said second signal.

17. A receiver comprising:
- an antenna array system;
- a conditioning unit arranged downstream of said antenna array system, wherein said conditioning unit is configured to convert a first signal into a second signal; and
- a signal processing unit arranged downstream of said conditioning unit, wherein said signal processing unit comprises a first weighting processor configured to apply a first complex weight to said second signal so as to generate a third signal, a limiter configured to approximate a first value of a sample associated with said second signal into a second value, a phase alignment module configured to align a phase of said second signal with its input associated with said second value so as to generate a fourth signal, and a first adaptive processor configured to update said first complex weight based on first information associated with said third and fourth signals.

18. The receiver of claim 17, wherein said signal processing unit further comprises a second weighting processor configured to apply a second complex weight to said second signal so as to generate a fifth signal, wherein said sample is associated with said fifth signal.

19. The receiver of claim 18, wherein said signal processing unit further comprises a second adaptive processor configured to update said second complex weight based on second information associated with said fifth signal.

20. The receiver of claim 17, wherein said first signal is amplified, frequency down-converted and digitized by said conditioning unit into said second signal.

* * * * *